(12) United States Patent
Pio (10) Patent No.: US 11,532,490 B2
(45) Date of Patent: Dec. 20, 2022

(54) SEMICONDUCTOR PACKAGES WITH INDICATIONS OF DIE-SPECIFIC INFORMATION

(71) Applicant: Micron Technology, Inc., Boise, ID (US)

(72) Inventor: Federico Pio, Brugherio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/548,084

(22) Filed: Aug. 22, 2019

(65) Prior Publication Data

US 2021/0057232 A1 Feb. 25, 2021

(51) Int. Cl.
| | | |
|---|---|---|
| H01L 21/56 | (2006.01) | |
| H01L 21/78 | (2006.01) | |
| H01L 23/28 | (2006.01) | |
| H01L 23/00 | (2006.01) | |
| H01L 23/544 | (2006.01) | |
| H01L 21/67 | (2006.01) | |

(52) U.S. Cl.
CPC ......... *H01L 21/561* (2013.01); *H01L 21/568* (2013.01); *H01L 21/78* (2013.01); *H01L 23/28* (2013.01); *H01L 23/544* (2013.01); *H01L 24/19* (2013.01); *H01L 24/20* (2013.01); *H01L 24/92* (2013.01); *H01L 24/96* (2013.01); *H01L 24/97* (2013.01); *H01L 21/67242* (2013.01); *H01L 2223/54413* (2013.01); *H01L 2223/54433* (2013.01); *H01L 2223/54493* (2013.01)

(58) Field of Classification Search
CPC ............. H01L 23/544; H01L 21/67242; H01L 2021/60075; H01L 2223/54433; H01L 2223/54413; H01L 2223/544–54493
See application file for complete search history.

(56) References Cited

U.S. PATENT DOCUMENTS

| | | | | |
|---|---|---|---|---|
| 3,598,490 A * | 8/1971 | Yearsley | ........... | H01L 21/67242 |
| | | | | 355/77 |
| 5,408,131 A * | 4/1995 | Khatri | ................... | H01L 23/544 |
| | | | | 257/48 |
| 7,548,643 B2 * | 6/2009 | Davis | ..................... | G07D 7/004 |
| | | | | 382/141 |
| 8,453,922 B2 | 6/2013 | Ragnet et al. | | |

(Continued)

OTHER PUBLICATIONS

Markman, A. et al.; "Photon-Counting Security Tagging and Verification Using Optically Encoded QR Codes"; IEEE Photonics Journal, vol. 6, No. 1, Feb. 2014; (c) 2014 IEEE; 10 pages; DOI: 10.1109/JPHOT.2013.2294625.

(Continued)

*Primary Examiner* — David A Zarneke
(74) *Attorney, Agent, or Firm* — Perkins Coie LLP (57) ABSTRACT

Semiconductor device packages and associated methods are disclosed herein. In some embodiments, the semiconductor device package includes (1) a first surface and a second surface opposite the first surface; (2) a semiconductor die positioned between the first and second surfaces; and (3) an indication positioned in a designated area of the first surface. The indication includes a code presenting information for operating the semiconductor die. The code is configured to be read by an indication scanner coupled to a controller.

17 Claims, 12 Drawing Sheets

(56) References Cited

U.S. PATENT DOCUMENTS

| | | | |
|---|---|---|---|
| 8,489,924 B2* | 7/2013 | Nakatsugawa | G06F 11/008 |
| | | | 714/26 |
| 10,019,627 B2 | 7/2018 | Kutter et al. | |
| 10,359,705 B2 | 7/2019 | Wang | |
| 10,566,222 B2* | 2/2020 | Yokoyama | H01L 21/67294 |
| 10,714,427 B2* | 7/2020 | De Langen | G06K 19/06178 |
| 11,063,000 B2* | 7/2021 | Dankowski | H01L 23/49541 |
| 11,217,537 B2* | 1/2022 | Kong | H01L 23/544 |
| 2005/0052706 A1 | 3/2005 | Nelson | |
| 2008/0121709 A1* | 5/2008 | Hayashi | H01L 23/544 |
| | | | 235/454 |
| 2017/0242137 A1* | 8/2017 | Sgiarovello | H01L 23/5256 |
| 2017/0243831 A1* | 8/2017 | Butler | H01L 23/544 |
| 2019/0304663 A1* | 10/2019 | Shimoichi | H01L 23/544 |
| 2019/0304920 A1* | 10/2019 | Piper | H01L 23/544 |
| 2020/0176507 A1* | 6/2020 | Hall | H01L 33/62 |
| 2020/0328102 A1* | 10/2020 | Schepis | H01L 23/544 |
| 2020/0328103 A1* | 10/2020 | Fulford | H01L 23/528 |

OTHER PUBLICATIONS

Noor, Y. MD. et al.; "A Review of the Nd: YAG Laser Marking of Plastic and Ceramic IC Packages"; Journal of Materials Processing Technology 42 (1994); pp. 95-133; 1994 Elsevier Science B.V.

* cited by examiner

SEMICONDUCTOR PACKAGES WITH INDICATIONS OF DIE-SPECIFIC INFORMATION

TECHNICAL FIELD

The present technology is directed to semiconductor packages with indications of die-specific information. More particularly, some embodiments of the present technology relate to a semiconductor package with machine-readable codes thereon for indicating information (e.g., operations parameters) regarding a semiconductor die in the semiconductor package.

BACKGROUND

Packaged semiconductor dies, including memory chips, microprocessor chips, logic chips and imager chips, typically include a semiconductor die mounted on a substrate and encased in a plastic protective covering. Individual semiconductor die can include functional features, such as memory cells, processor circuits, imager devices and other circuitry, as well as bond pads electrically connected to the functional features. To properly operate the semiconductor die, certain die-specific parameters for operating the semiconductor die, such as current, voltage, resistance reference values, etc., must be optimized at die level to account for process variations, for example. Such die-specific parameters are traditionally stored in special non-volatile elements, such as fuses or anti-fuses, that are realized in the die itself. This can be expensive and unreliable.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Specific details of several embodiments of stacked semiconductor die packages and methods of manufacturing such die packages are described below. The term "semiconductor device" generally refers to a solid-state device that includes one or more semiconductor materials. A semiconductor device can include, for example, a semiconductor substrate, wafer, or die that is singulated from a wafer or substrate. Throughout the disclosure, semiconductor dies are generally described in the context of semiconductor devices but are not limited thereto.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device package assembly" can refer to an assembly that includes multiple stacked semiconductor device packages. As used herein, the terms "vertical," "lateral," "upper," and "lower" can refer to relative directions or positions of features in the semiconductor device or package in view of the orientation shown in the Figures. These terms, however, should be construed broadly to include semiconductor devices having other orientations, such as inverted or inclined orientations.

Figure 1:
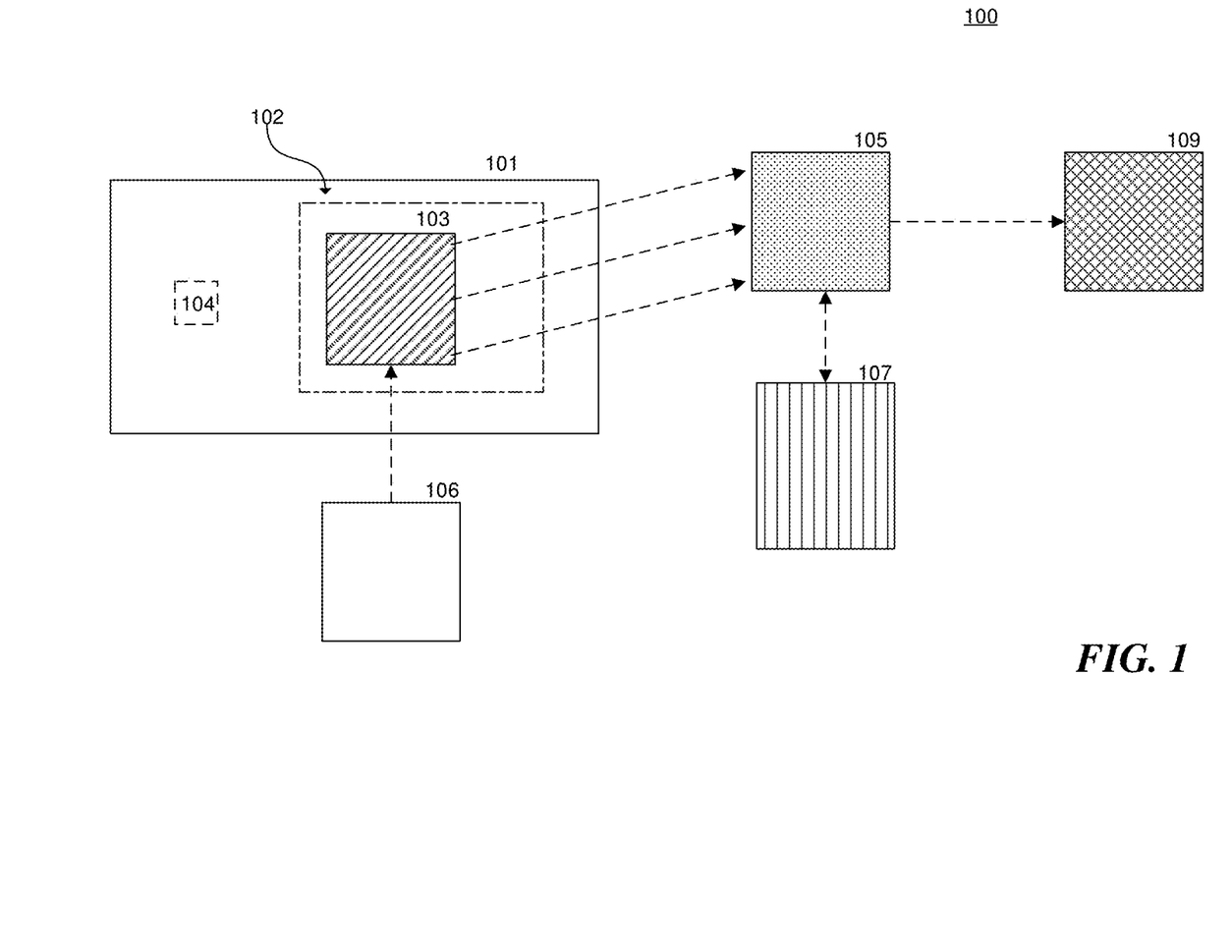
FIG. 1 is a schematic diagram of a system for delivering information regarding a semiconductor die in a semiconductor device package in accordance with an embodiment of the present technology.

FIG. 1 is a schematic diagram of a system 100 for delivering information regarding a semiconductor die in a semiconductor device package in accordance with an embodiment of the present technology. The system 100 includes a semiconductor device package 101, a semiconductor die 104 in the semiconductor device package 101, an indication 103 on the semiconductor device package 101, an indication reader 105, a controller 107, and a data storage 109. In some embodiments, the semiconductor device package 101 can be a portion (e.g., the upmost portion) of a semiconductor device package assembly, which can include multiple stacked semiconductor device packages.

As shown in FIG. 1, the semiconductor device package 101 has a designated area 102 for displaying the indication 103. In some embodiments, the designated area 102 is located at a top surface of the semiconductor device package 101. In some embodiments, the designated area 102 is located at a bottom surface of the semiconductor device package 101. In some embodiments, the designated area 102 is located at a side surface of the semiconductor device package 101. In some embodiments, the semiconductor device package 101 can have more than one designated area 102 at different locations (e.g., two different locations at the top surface; a location at the side surface and another location at the bottom surface, etc.).

The indication 103 is configured to present or deliver information associated with the semiconductor die 104 in the semiconductor device package 101. The information associated with the semiconductor die 104 can include, for example, suitable current, voltage, voltage adjustments, delays, redundancy information, firmware instructions, power-on/off instructions, etc., for operating the semiconductor die 104. In some embodiments, the information associated with the semiconductor die 104 can include a testing result for the specific semiconductor die 104 (e.g., the testing result can indicate how the semiconductor die 104 performs under certain conditions or environments). In some embodiments, the information associated with the semiconductor die 104 can be used to achieve optimal functionality of the semiconductor die. For example, the information can include a voltage range $V_1$-$V_2$ to achieve proper performance of the semiconductor die 104. For example, the information can include trimming parameters for voltages, current generators, and/or regulators. For example, the information can include addresses for redundancy, such as addresses of failing memory locations that can be replaced by functional memory locations. As another example, the information can include a set of instructions that needs to be loaded to a processor to power up and control the semiconductor die 104.

In some embodiments, the indication 103 can include a set of machine-readable codes. In some embodiments, the indication 103 can include a pattern, a one-dimensional barcode, a two-dimensional barcode (e.g., a matrix barcode such as a Quick Response (QR) code), and other suitable codes. In some embodiments, the indication 103 can be positioned or formed on the semiconductor device package 101 by a printing process. In some embodiments, the indication 103 can be positioned or formed on the semiconductor device package 101 by one or more processes involving stamping, etching, engraving, lasering, thermal molding, adhesives, etc.

The indication reader 105 is configured to read the machine-readable codes of the indication 103. In some embodiments, the indication reader 105 can be an optical scanner. In some embodiments, the indication-reader 105 can be a barcode reader. In some embodiments, the indication-reader 105 can be a laser scanner. The indication reader 105 is coupled to the controller 107 and controlled thereby. For example, the controller 107 can instruct the indication reader 105 to initiate a reading process to read and analyze the machine-readable codes in the indication 103 and accordingly obtains the information associated with the semiconductor die 104. The information associated with the semiconductor die 104 can then be sent to the data storage 109 for future use.

In some embodiments, the data storage 109 can be a storage device or a disk drive coupled to the indication reader 105. In some embodiments, the data storage 109 can be a database communicably coupled to the indication reader 105 (e.g., via a wired or wireless network such as the Internet or an intranet).

In some embodiments, at least a portion of the information associated with the semiconductor die 104 can be stored in a non-volatile component (e.g., a fuse, a non-volatile memory, etc.) of the semiconductor device package 101. In such embodiments, the information stored in the non-volatile component can be directly accessed by the operator of the semiconductor die 104, without using the indication reader 105. In some embodiments correctness of the information stored in non-volatile components of the semiconductor device package 101 (for example a fuse or a non-volatile memory in the semiconductor die) can be verified by comparison with the indication 103 presented on the semiconductor device package 101 and re-stored if necessary. In other embodiments, however, the semiconductor device package 101 does not have a non-volatile component (e.g., a fuse, a non-volatile memory, etc.) and accordingly the information associated with the semiconductor die 104 is stored by the indication 103.

In some embodiments, the information associated with the semiconductor die 104 can be encrypted for security purposes. In some embodiments, to decode the encrypted information associated with the semiconductor die 104, a key (e.g., a software key) or a passcode may be required. By this arrangement, the present technology provides a secured way to deliver die-specific information such that only authorized operators can access the encrypted information associated with the semiconductor die 104.

In some embodiments, the semiconductor die 104 can be tested for functionality, for example, during an Electrical Wafer Sorting (EWS) test. During the test, a set of optimal operation/working parameters can be determined, such as trimming parameters for voltage/current generators and regulators, addresses for memory cell redundancy, etc. The set of optimal operation/working parameters can be stored in the data storage 109 and/or controlled by the controller 107. In some embodiments, a writing apparatus 106 can be configured to form the indication 103 in the designated area 102 of the semiconductor device package 101, after the semiconductor device package 101 has been packed. For example, the indication 103 can include one or more one-dimensional and/or two-dimensional codes. In other words, the die-specific information associated with the semiconductor die 104 can be encoded and written on its package for future use, as described above.

In some embodiments, the information associated with the semiconductor die 104 can include customized information requested by a user. For example, the user can request a manufacturer of the semiconductor device package 101 to add information in the indication 103.

Such information can include, for example, internal batch/reference numbers used by the user, versions of the firmware in the semiconductor die, technical notes regarding how to operate the semiconductor device package 101 created by the user, etc. By this arrangement, the present technology enables a user to add inherent, customized information in the semiconductor device package 101.

FIGS. 2A-2H are schematic views illustrating a semiconductor device package 201 in accordance with embodiments of the present technology. As shown in FIGS. 2A-2H, the semiconductor device package 201 includes an indication 203 (individually identified as indications 203a-h in various embodiments described in FIGS. 2A-2H, respectively) thereon and multiple connectors 204 (e.g., conductive pins, legs, etc.) configured to couple to an external device.

Figure 2A:
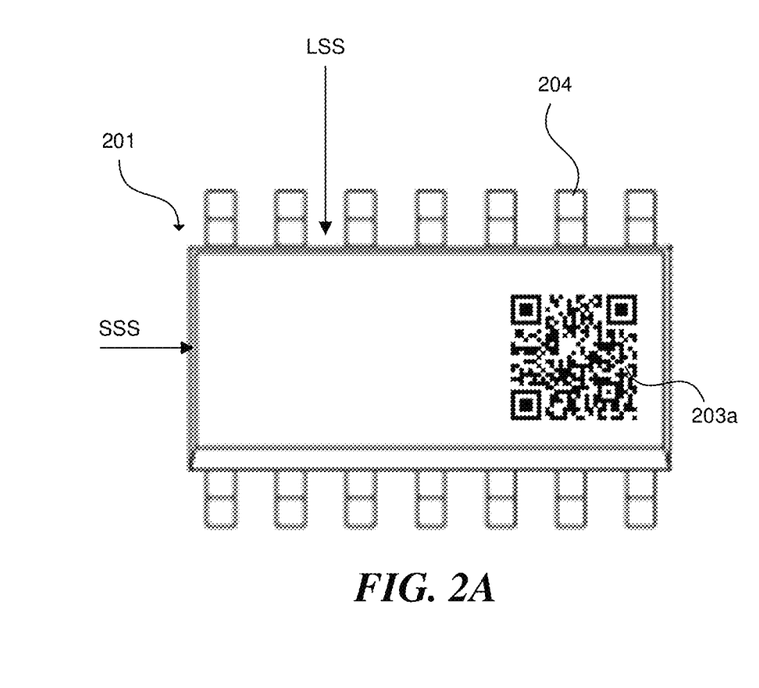
FIGS. 2A-2H are schematic views illustrating semiconductor device packages in accordance with an embodiment of the present technology.
Figure 2B:
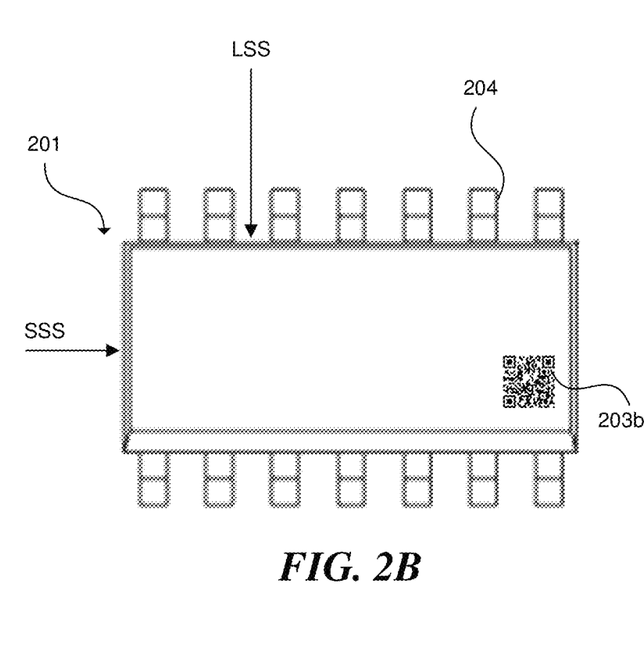
Figure 2C:
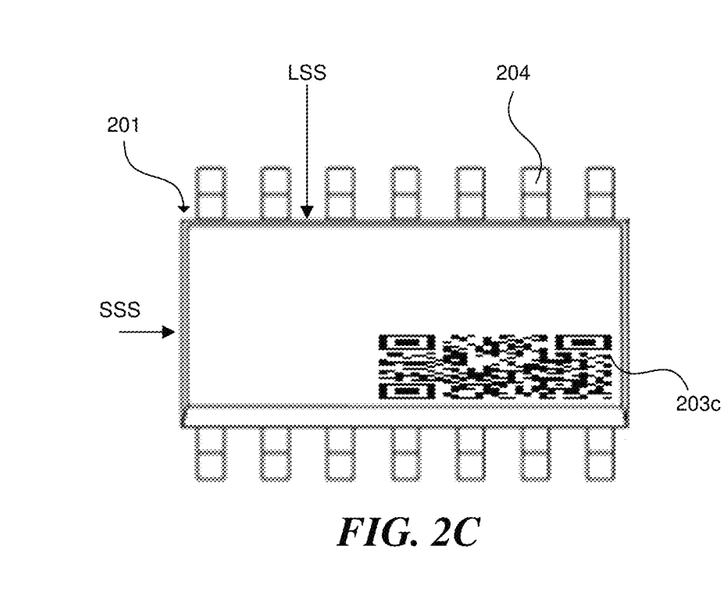
Figure 2D:
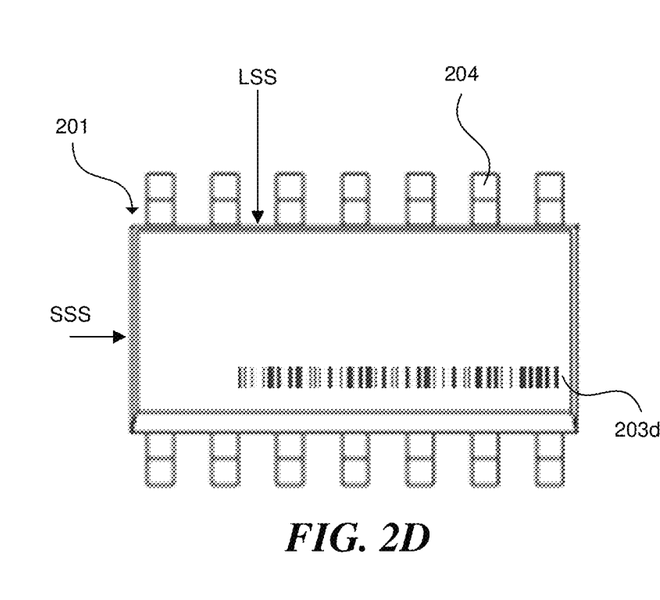

FIGS. 2A-2D are top views of the semiconductor device package 201. In FIG. 2A, the indication 203a includes a square-shaped, two-dimensional code at the top surface of the semiconductor device package 201. In FIG. 2B, compared to FIG. 2A, the indication 203b is also a square-shaped, two-dimensional code with a size smaller than the size of the indication 203a. In FIG. 2C, the indication 203c includes a rectangular-shaped, two-dimensional code at the top surface of the semiconductor device package 201. In FIG. 2D, the indication 203d includes a one-dimensional code at the top surface of the semiconductor device package 201. In some embodiments, the indications 203a-d can be located at other locations (e.g., at the center) of the top surface of the semiconductor device package 201.

Figure 2E:
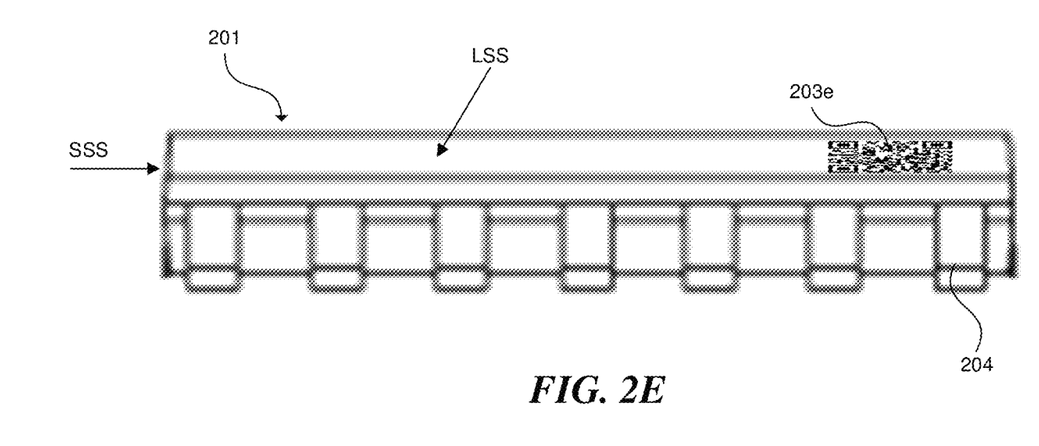
Figure 2F:
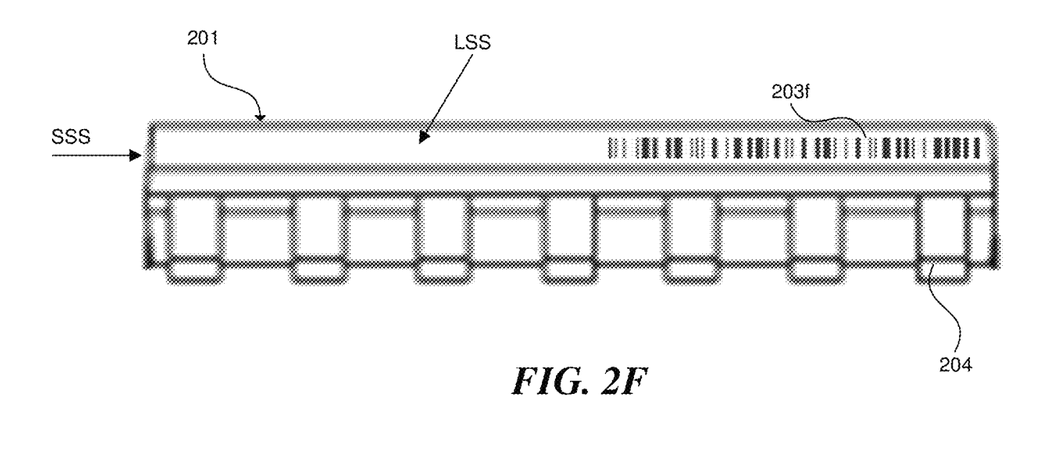
Figure 2G:
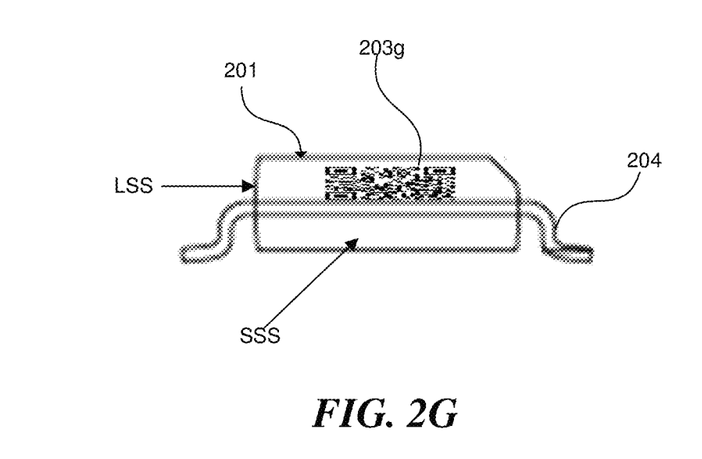
Figure 2H:
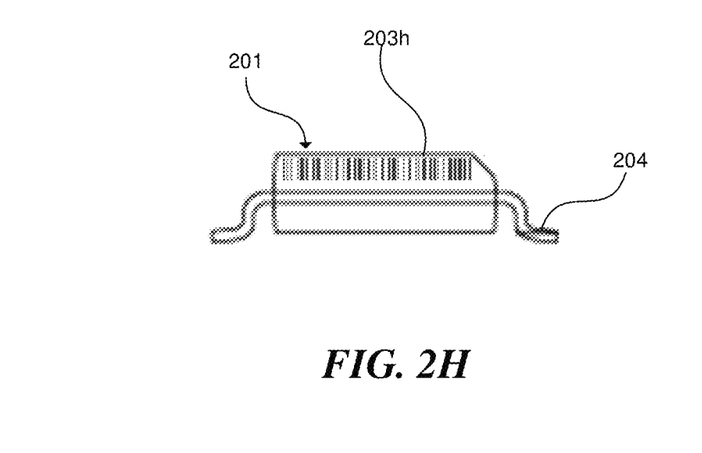

FIGS. 2E-2H are side views of the semiconductor device package 201. The indication 203e in FIG. 2E is a rectangular-shaped, two-dimensional code at a long, side surface (LSS) of the semiconductor device package 201. In FIG. 2F, the indication 203f can be a one-dimensional barcode at the LSS of the semiconductor device package 201. The indication 203g in FIG. 2G is a rectangular-shaped, two-dimensional code at a short, side surface (SSS) of the semiconductor device package 201. In FIG. 2H, the indication 203h is a one-dimensional barcode at the SSS of the semiconductor device package 201.

Embodiments discussed in FIGS. 2A-2H include indications at respective designated areas of a surface of the semiconductor device package 201. In some embodiments, the designated area can be positioned/aligned with respect to other marks (e.g., a manufacturer logo) and/or structural elements (e.g., package corner, conductive leg, etc.) that are conveniently identifiable so that the indications can be formed without using a reference sign (e.g., an alignment mark). This arrangement enables efficient uses of the designated areas (e.g., which can be used for storing more information).

Figure 3A:
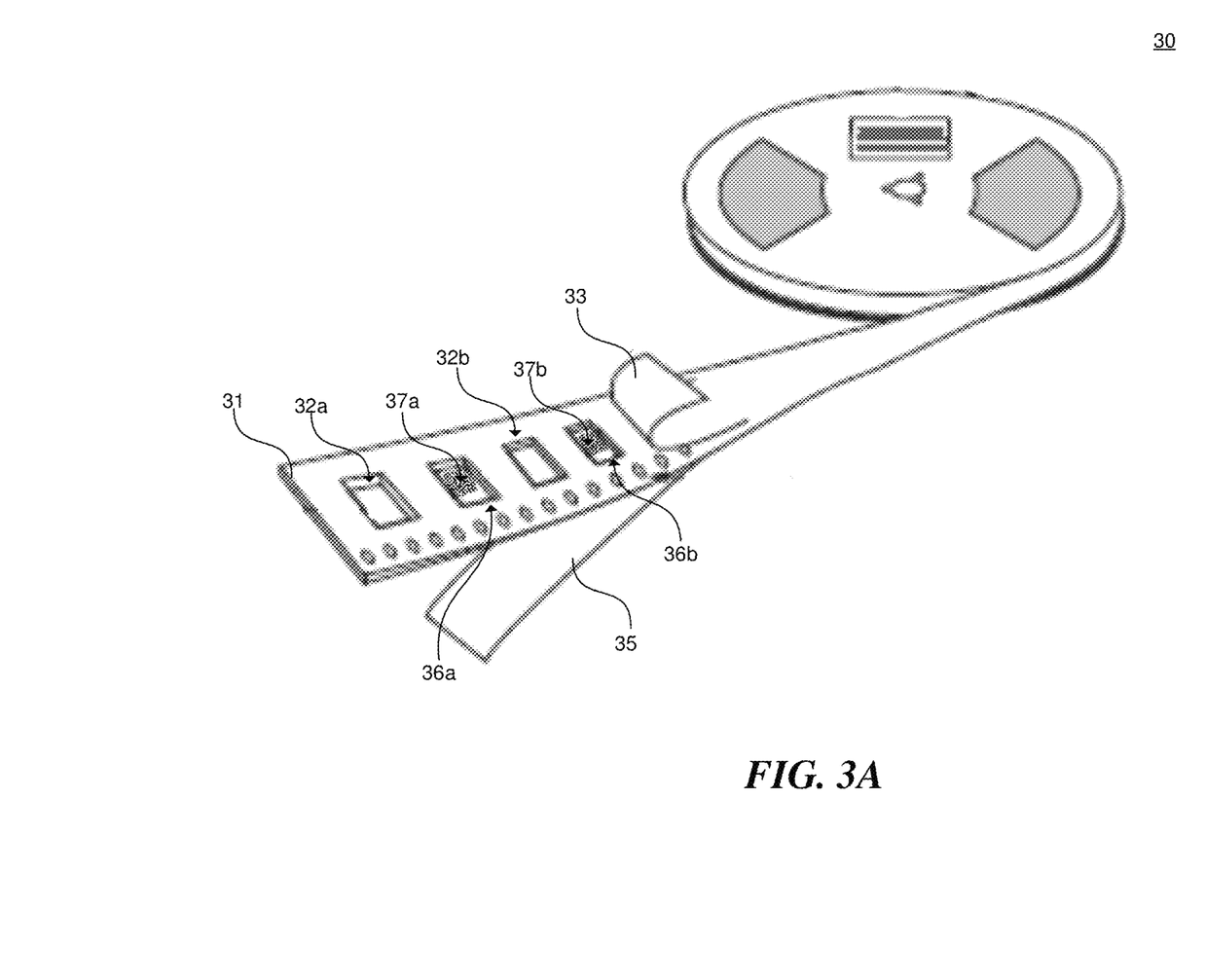
FIGS. 3A-3D are schematic views illustrating methods of delivering information regarding a semiconductor die in a semiconductor device package in accordance with an embodiment of the present technology.

FIGS. 3A-3D are schematic views illustrating methods of delivering information regarding a semiconductor die in a semiconductor device package in accordance with embodiments of the present technology. FIG. 3A illustrates a reel system 30 configured to carry multiple semiconductor device packages and provide the corresponding indications for each semiconductor device package. The reel system 30 includes a tape 31 having multiple recesses 32a-b configured to carry a semiconductor device package and/or an indication with the die-specific information. The reel system 30 also includes a top cover 33 and a bottom cover 35 configured to protect the tape 31 and the multiple semiconductor device packages carried by the tape 31.

Figure 3B:
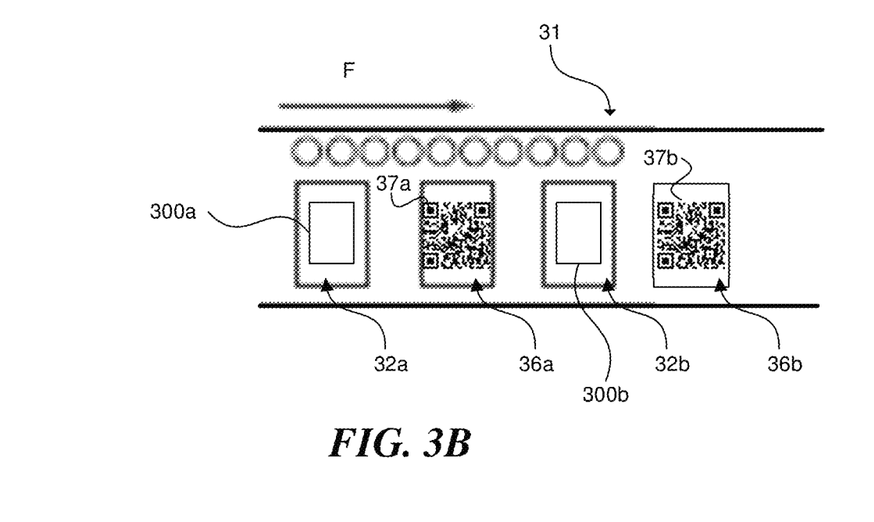

The embodiment shown in FIGS. 3A and 3B has a first semiconductor device package 300a in recess 32a and a second semiconductor device package 300b in recess 32b. The tape 31 also includes areas 36a-b and indications 37a-b at the areas 36a-b, respectively. The indication 37a associated with the first semiconductor device package 300a can be at area 36a. Similarly, the indication 37b associated with the second semiconductor device package 300b can be at area 36b. Areas 36a-b can be recesses as shown in FIGS. 3A and 3B, or they can be an embossment or a flat surface.

Referring to FIG. 3B, the tape 31 can be moved and processed in a feeding direction F such that the indication 37b with the die-specific information for the second semiconductor device package 300b is read before the second semiconductor device package 300b is accessed or processed, and then the indication 37a with the die-specific information for the first semiconductor device package 300a is read before the first semiconductor device package 300a is accessed or processed. Accordingly, when accessing and/or processing the semiconductor device packages 300a-b, an operator (or a corresponding system) can have specific information about how to properly handle and/or operate the semiconductor device packages 300a-b. For example, the die-specific information for each of the semiconductor dice in the semiconductor device packages 300a-b can be stored in configuration elements (e.g., fuses, anti-fuses, etc.) in corresponding semiconductor die or stored in a system memory, which can later be used to power on the corresponding semiconductor die.

In some embodiments, the die-specific information can be read by an indication reader, under control of a controller, and corresponding data can be stored in a data storage. The indication reader, the controller and the data storage can be the indication reader 105, the controller 107, and the data storage 109 depicted in FIG. 1. In some embodiments, the data storage can be a memory in the semiconductor die (e.g., non-volatile memory cells, fuses, etc.). In some embodiments, the data storage is external to the semiconductor die and the stored data can be accessed and uploaded (e.g., in configuration latches of the semiconductor die) to power on the semiconductor die.

Figure 3C:
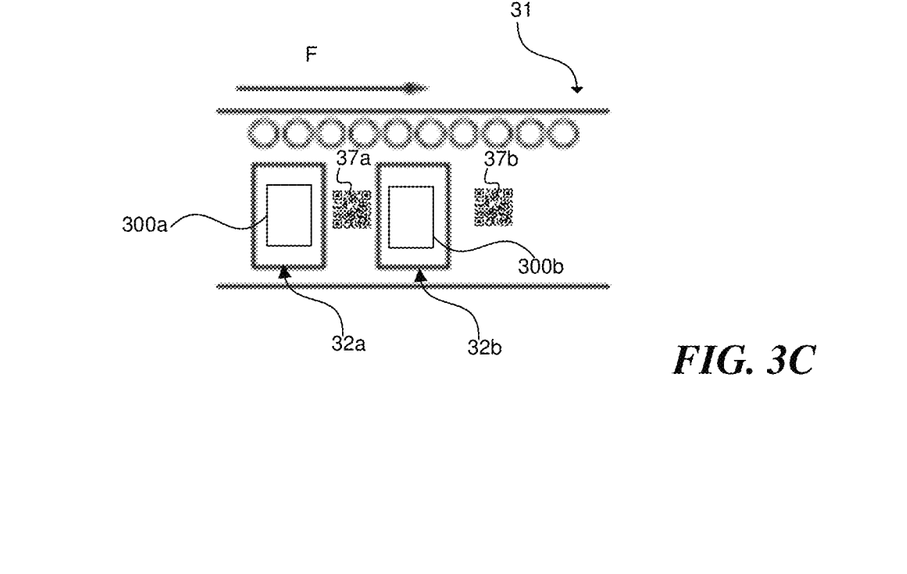
Figure 3D:
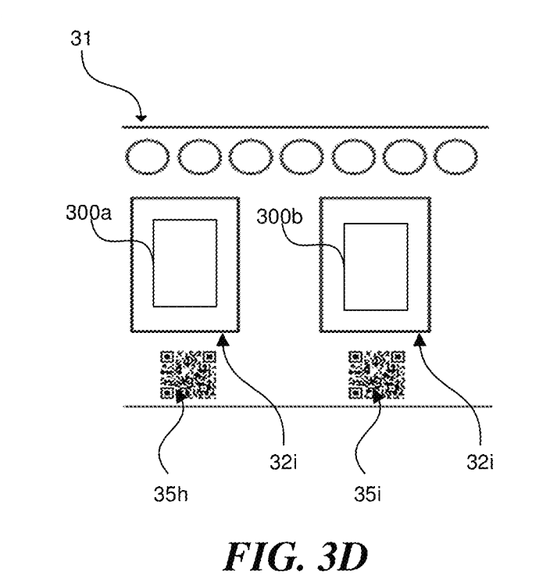

FIGS. 3C and 3D show embodiments in which the indications 37a-b are printed on the tape 31. In the embodiment illustrated in FIG. 3C, the indications 37a-b can be printed in front of and adjacent to the recesses 32a-b, respectively. In the embodiment shown in FIG. 3D, the indications 37a-b are printed at the side of and adjacent to the recesses 32a-b, respectively.

Figure 4A:
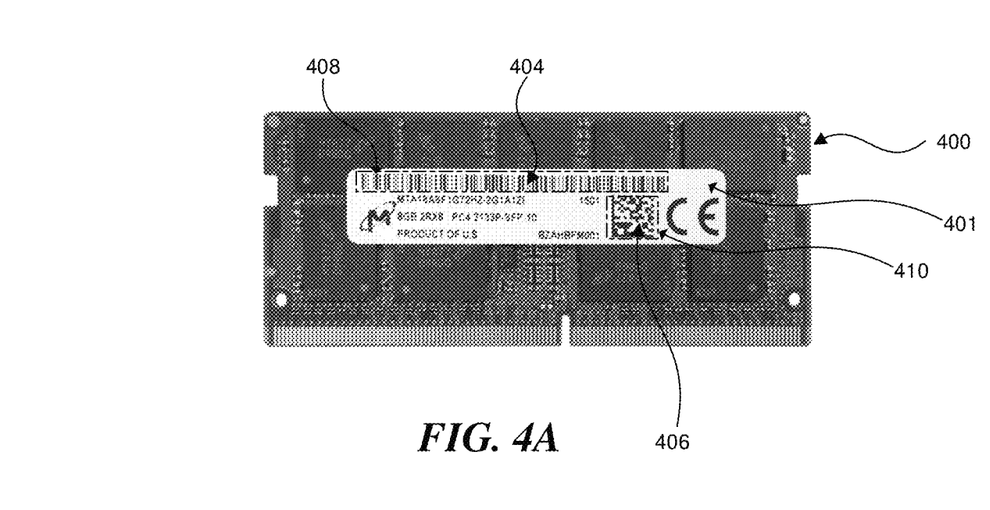
FIGS. 4A and 4B show semiconductor device packages in accordance with an embodiment of the present technology.
Figure 4B:
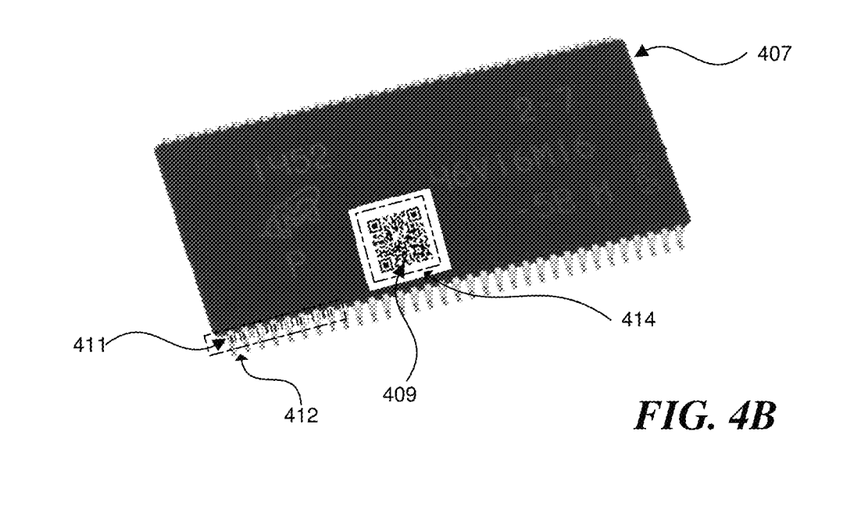

FIGS. 4A and 4B show semiconductor device packages in accordance with embodiments of the present technology. In FIG. 4A, a memory device 400 can have a sticker 401 with a barcode 404 and a QR code 406 thereon. The barcode 404 is located in a first designated area 408, and the QR code 406 is located at a second designated area 410. The first designated area 408 and the second designated area 410 can be on the same surface of the memory device 400. In other embodiments, however, the first designated area 408 and the second designated area 410 can be on different surfaces (e.g., two surfaces opposite, or adjacent, to each other). Both the barcode 404 and the QR code 406 are used to carry information associated with the memory device 400 (e.g., parameters for operations). Although embodiments discussed in FIGS. 4A and 4B have two sets of codes 404, 406, in other embodiments, however, there can be other number(s) of code(s), such as one, three or more, etc.

In some embodiments, the barcode 404 and the QR code 406 can be used to carry generally the same information regarding the memory device 400. In such embodiments, an operator of the memory device 400 can retrieve the information regarding the memory device 400 from either the barcode 404 or the QR code 406. For example, the operator can read the barcode 404 by a barcode reader. As another example, the operator can read the QR code 406 by a QR-code reader. In some embodiments, the operator can read both the barcode 404 or the QR code 406 by an optical reader. In such embodiments, the information read from the barcode 404 can be compared to the information read from the QR code 406 such that the information regarding the memory device 400 can be verified.

In some embodiments, the barcode 404 can be used to carry a first portion of information for operating the memory device 400, and the QR code 406 can be used to carry a second portion of the information for operating the memory device 400. This provides flexibility for operating or processing the memory device 400 in different stages. For example, the barcode 404 can store a first set of information to power up the memory device 400 in a first stage (e.g., an initiating stage). The QR code 406 can store a second set of information to operate the memory device 400 in a second stage (e.g., an operating stage). In these embodiments, an operator can use proper scanners to read the barcode 404 in the first stage and the read the QR code in the second stage.

In some embodiments, one of the barcode 404 and the QR code 406 can include authentication information (e.g., a product identification, a customer identification, a manufacturing batch/date, etc.), whereas the other one can include information for operating the memory device 400. In some embodiments, an operator needs to receive the authentication information and then the operator can access the information regarding the memory device 400. For example, the authentication information includes a key for decoding the information regarding the memory device 400. By this arrangement, the present technology provides a secured method for delivering operational information to an operator or a customer.

FIG. 4B shows a stacked integrated circuit (IC) device 407 with a QR code 409 and a barcode 411. The barcode 411 is at a first designated area 412, and the QR code 409 is at a second designated area 414. The first designated area 412 is on a side surface of the stacked IC device 407, and the second designated area 414 is on a top surface of the stacked IC device 407. Similar to the barcode 404 and the QR code 406 discussed above, the QR code 409 and the barcode 411 can include generally the same or different information associated with the stacked IC device 407.

Figure 4C:
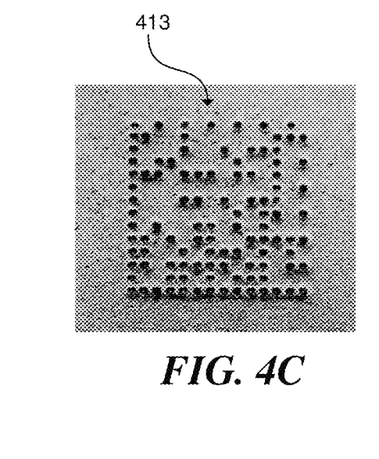
FIG. 4C is an image showing a pattern in accordance with an embodiment of the present technology.

FIG. 4C is an image showing an indication 413 having a pattern of dots in accordance with an embodiment of the present technology. The location of each dot can mean bit information "1" and a space (i.e., without a dot, or an "empty" dot) can mean bit information "0." By having multiple dots and spaces in the pattern 413, the pattern 413 can be used to provide the die-specific information associated with a semiconductor device package as discussed above. In some embodiments, shapes other than dots (e.g., squares, triangles, segments, etc.) can be used. In some embodiments, the relative positions or relationships of the dots (or other shapes) can be used to encode the information in a pattern.

Figure 4D:
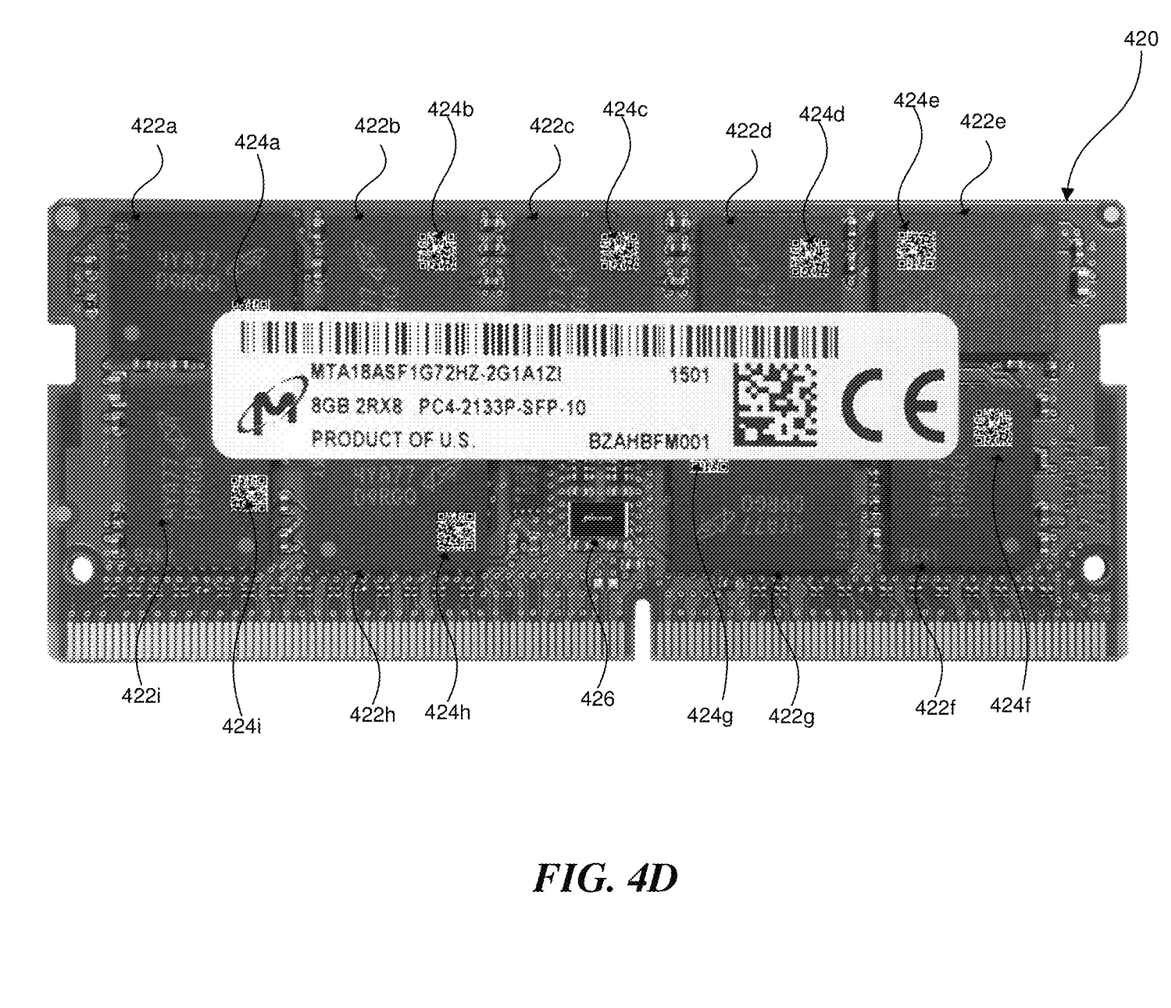
FIG. 4D shows a semiconductor device package in accordance with an embodiment of the present technology.

FIG. 4D shows a memory device 420 in accordance with an embodiment of the present technology. The memory device 420 include nine memory module packages 422 (indicated as 422a-i in FIG. 4D). Each the memory module packages 422 has a QR code 424 thereon (indicated as 424a-i in FIG. 4D). The individual QR codes 424 are configured to deliver die-specific parameters for each semiconductor die in the individual memory module packages 422. These QR codes 424 can be optically read and then stored in a storage device (e.g., a non-volatile component 426 of the memory device 420). The storage device can store additional information, for example, information useful for operating the memory device 420. During a power-on process of the memory device 420, the die-specific information can be used to activate/operate each die in respective memory module package 422 and the memory device 420.

Figure 5:
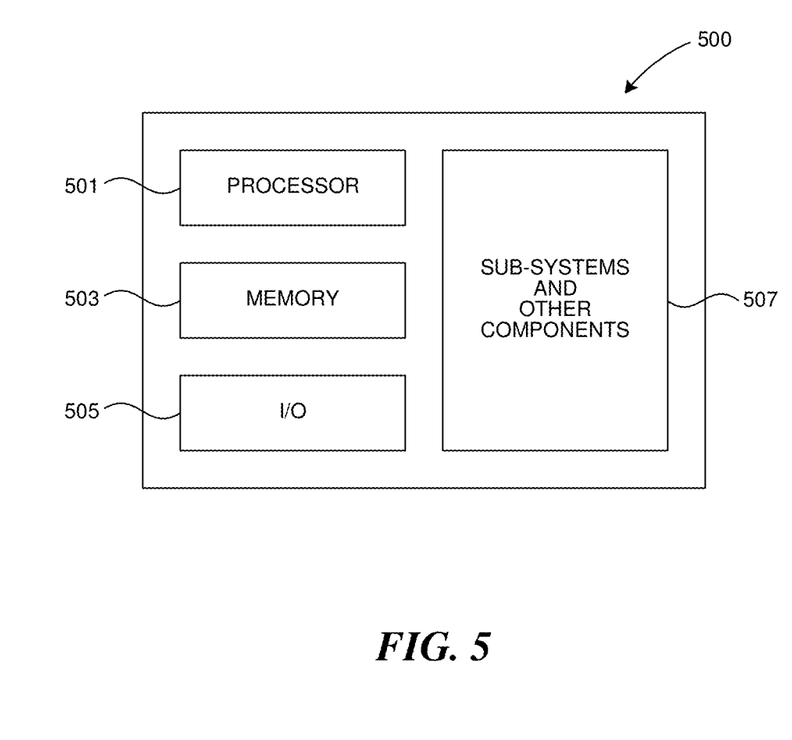
FIG. 5 is a block diagram illustrating a system that incorporates a semiconductor assembly in accordance with an embodiment of the present technology.

FIG. 5 is a block diagram illustrating a system that incorporates a semiconductor assembly in accordance with embodiments of the present technology. Any one of the semiconductor devices described above with reference to FIGS. 1-4D can be incorporated into any of a myriad of larger and/or more complex systems, a representative example of which is a system 500 shown schematically in FIG. 5. The system 500 can include a processor 501, a memory 503 (e.g., SRAM, DRAM, flash, and/or other memory devices), input/output devices 505, and/or other subsystems or components 507. The semiconductor assemblies, devices, and device packages described above with reference to FIGS. 1-4D can be included in any of the elements shown in FIG. 5. In some embodiments, the system 500 can include a non-volatile memory for storing die-specific information for at least some of the components in the system 500. For example, configuration parameters (e.g., voltage, current, delay and/or resistance trimming parameters, redundancy addresses, etc.) can be stored in the non-volatile memory and uploaded to corresponding components at a power-on process of the system 500. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. With regard to these and other examples, the system 500 can be housed in a single unit or distributed over multiple interconnected units, e.g., through a communication network. The components of the system 500 can accordingly include local and/or remote memory storage devices and any of a wide variety of suitable computer-readable media.

Figure 6:
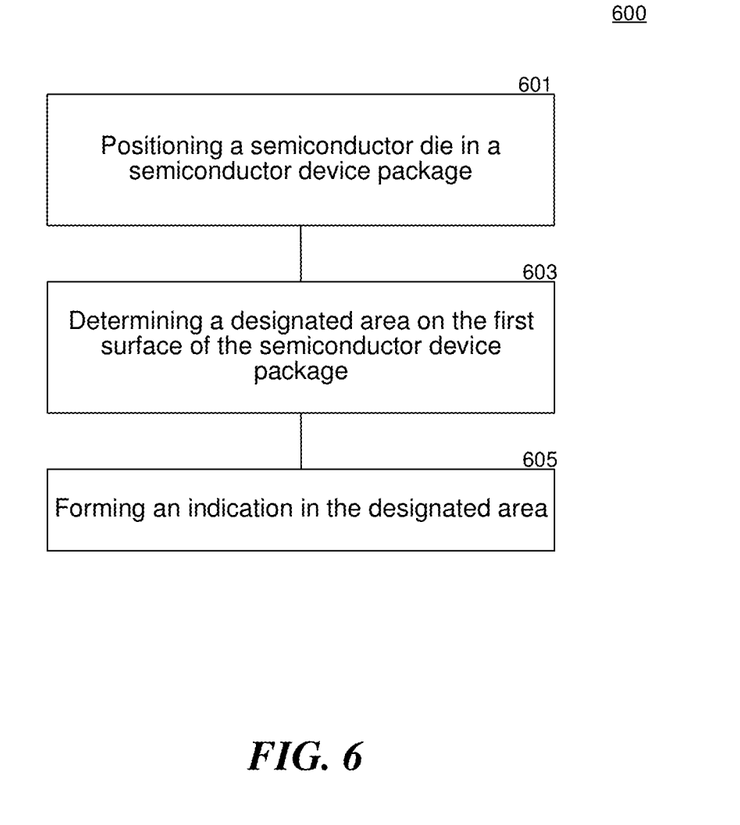
FIG. 6 is a flowchart illustrating a method in accordance with an embodiment of the present technology.

FIG. 6 is a flowchart illustrating a method 600 in accordance with an embodiment of the present technology. The method 600 can be implemented by a system (e.g., the system 100 discussed above). The method 600 is to provide or deliver information regarding a semiconductor die. At block 601, the method 600 starts by positioning the semiconductor die in a semiconductor device package. The semiconductor device package has a first surface. At block 603, the method 600 continues by determining a designated area on the first surface. At block 605, the method 600 includes forming an indication in the designated area. The indication includes a code presenting information for operating the semiconductor die. The code is configured to be read by an indication scanner.

Figure 7:
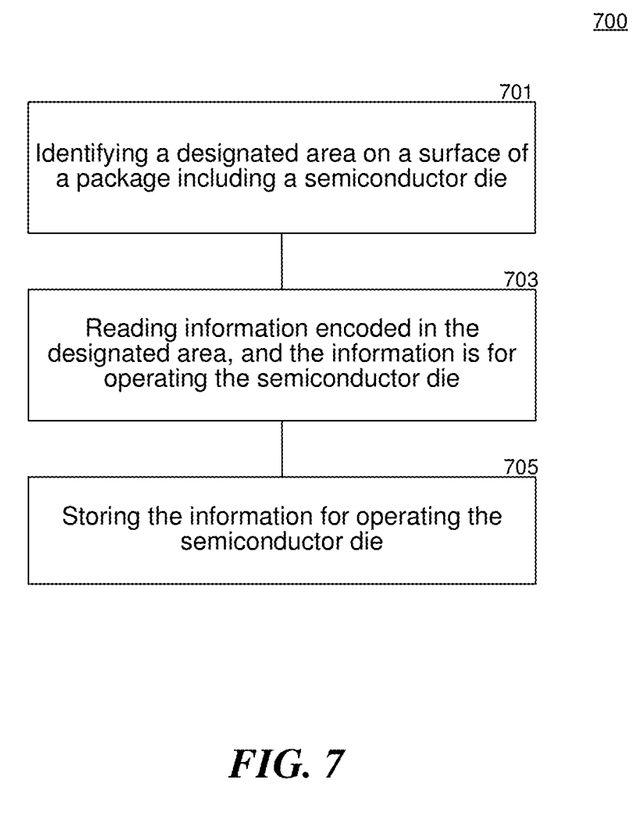
FIG. 7 is a flowchart illustrating a method in accordance with an embodiment of the present technology.

FIG. 7 is a flowchart illustrating a method 700 in accordance with an embodiment of the present technology. The method 700 can be implemented by a system (e.g., the system 100 discussed above). The method 700 is to retrieve or make available information regarding a semiconductor die. At block 701, the method 700 starts by identifying a designated area on a surface of a package including a semiconductor die. At block 703, the method 700 continues by reading information encoded in the designated area, and the information is for operating the semiconductor die. At block 705, the method 700 includes storing the information for operating the semiconductor die. In some embodiments the reading can be performed by an indication scanner (e.g., the indication scanner 105) under the control of a controller (e.g., the controller 107). The information can be stored in a data storage (e.g., the data storage 109). In some embodiments, the information can include information for operating the semiconductor die such as trimming parameters and/or redundancy addresses. The information can be uploaded to a component (e.g., configuration elements or configuration latches) of the semiconductor die during a power-on or configuration process.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

I claim:

1. A semiconductor device package, comprising:
   a first surface and a second surface opposite the first surface;
   a semiconductor die between the first and second surfaces;
   a first indication at a designated area of the first surface, the first indication including a first code presenting information for operating the semiconductor die, the first code being configured to be read by an indication scanner; and
   a security indication on the first surface, the security indication including a security code presenting a key for decoding the information for operating the semiconductor die,
   wherein the information for operating the semiconductor die includes one or more parameters that include an address for redundancy.

2. The semiconductor device package of claim 1, wherein the semiconductor device package further comprises a second indication including a second code presenting the information for operating the semiconductor die.

3. The semiconductor device package of claim 2, wherein the second indication is positioned in the designated area of the first surface.

4. The semiconductor device package of claim 2, wherein the designated area is a first designated area, and wherein the second indication is positioned in a second designated area of the first surface.

5. The semiconductor device package of claim 2, wherein the designated area is a first designated area, and wherein the second indication is positioned in a second designated area of the second surface.

6. The semiconductor device package of claim 1, wherein the semiconductor device package does not include a fuse.

7. The semiconductor device package of claim 2, wherein the first code includes a QR code, and wherein the second code includes a barcode.

8. The semiconductor device package of claim 1, further comprising a configuration latch configured to receive the information for operating the semiconductor die during a power-on process of the semiconductor device package.

9. The semiconductor device package of claim 2, wherein the indication scanner is a first indication scanner, and wherein the second code is configured to be read by a second indication scanner.

10. The semiconductor device package of claim 1, wherein the information for operating the semiconductor die is a first set of information for operating the semiconductor die, and wherein the semiconductor device package further comprises a second indication including a second code presenting a second set of information for operating the semiconductor die.

11. The semiconductor device package of claim 10, wherein the second set of information is generally the same as the first set of information.

12. The semiconductor device package of claim 10, wherein the first set of information includes a first set of parameters for operating the semiconductor die, and wherein the second set of information includes a second set of parameters for operating the semiconductor die.

13. The semiconductor device package of claim 1, wherein the information for operating the semiconductor die includes a testing result of the semiconductor die.

14. A method of providing information associated with a semiconductor die, comprising:
    positioning the semiconductor die in a semiconductor device package, the semiconductor device package having a first surface;
    determining a designated area on the first surface;
    forming a first indication in the designated area, the first indication including a first code presenting information for operating the semiconductor die, the first code being configured to be read by an indication scanner; and
    forming a security indication on the first surface including a security code presenting a key for decoding the information for operating the semiconductor die,
    wherein the information for operating the semiconductor die includes one or more parameters that include an address for redundancy.

15. The method of claim 14, wherein the method further comprises forming a second indication including a second code presenting the information for operating the semiconductor die.

16. The method of claim 15, wherein the designated area is a first designated area, and wherein the method further comprises:
    determining a second designated area on the first surface; and
    forming the second indication in the second designated area.

17. The method of claim 15, wherein the designated area is a first designated area, and wherein the method further comprises:
    determining a second designated area on a side surface of the semiconductor device package; and
    forming the second indication in the second designated area.

* * * * *